(12) United States Patent
Guzy et al.

(10) Patent No.: US 11,797,067 B2
(45) Date of Patent: *Oct. 24, 2023

(54) SYSTEMS AND METHODS FOR RECONFIGURING DUAL-FUNCTION CELL ARRAYS

(71) Applicant: Arbor Company, LLLP, Glenbrook, NV (US)

(72) Inventors: Darrel James Guzy, Menlo Park, CA (US); Wei-Ti Liu, Saratoga, CA (US)

(73) Assignee: Arbor Company, LLLP, Glenbrook, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,418

(22) Filed: Aug. 1, 2022

(65) Prior Publication Data
US 2023/0100530 A1 Mar. 30, 2023

Related U.S. Application Data

(63) Continuation of application No. 17/374,754, filed on Jul. 13, 2021, now Pat. No. 11,435,800, which is a
(Continued)

(51) Int. Cl.
*G06F 1/32* (2019.01)
*G06F 1/26* (2006.01)
(Continued)

(52) U.S. Cl.
CPC .............. *G06F 1/263* (2013.01); *H01L 23/58* (2013.01); *H02J 7/0042* (2013.01);
(Continued)

(58) Field of Classification Search
CPC .......... G06F 1/263; G06F 1/30; G06F 1/3203; H01L 23/58; H01L 23/34; H01L 25/0657;
(Continued)

(56) References Cited

U.S. PATENT DOCUMENTS 5,737,766 A   4/1998   Tan
5,844,844 A   12/1998  Bauer et al.
(Continued)

FOREIGN PATENT DOCUMENTS

CN   1815628 A    8/2006
CN   201150078 Y  11/2008
(Continued)

OTHER PUBLICATIONS

International Patent Application No. PCT/US2020/029163, International Search Report and Written Opinion dated Jul. 17, 2020, 10 pages.
(Continued)

*Primary Examiner* — Volvick Derose
(74) *Attorney, Agent, or Firm* — Sheppard, Mullin, Richter & Hampton LLP

(57) ABSTRACT

A system comprises an integrated circuit die substrate; volatile memory electrically coupled to the integrated circuit die substrate; a first integrated circuit die element electrically coupled to the integrated circuit die substrate, the first integrated circuit die element comprising a first field programmable gate array (FPGA), and the first integrated circuit die element disposed adjacent to the volatile memory; a battery charger operable to receive power from a main power supply, the main power supply having an on state and an off state, wherein the main power supply is supplying power in the on state and not supplying power in the off state; and a battery module disposed on a top portion of the first integrated circuit die element, the battery module operable to receive power from the battery charger, and the battery module operable to supply power to the volatile memory at least when the main power supply is in the off state.

12 Claims, 6 Drawing Sheets

Related U.S. Application Data continuation of application No. 17/028,165, filed on Sep. 22, 2020, now Pat. No. 11,061,455, which is a continuation of application No. 16/810,790, filed on Mar. 5, 2020, now Pat. No. 10,782,759, which is a continuation-in-part of application No. 16/810,779, filed on Mar. 5, 2020, now Pat. No. 10,802,735, and a continuation-in-part of application No. 16/788,954, filed on Feb. 12, 2020, now abandoned, which is a continuation-in-part of application No. 16/777,554, filed on Jan. 30, 2020, now abandoned, said application No. 16/810,790 is a continuation-in-part of application No. 16/777,554, filed on Jan. 30, 2020, now abandoned, said application No. 16/810,779 is a continuation-in-part of application No. 16/777,554, filed on Jan. 30, 2020, now abandoned.

(60) Provisional application No. 62/850,996, filed on May 21, 2019, provisional application No. 62/837,704, filed on Apr. 23, 2019.

(51) Int. Cl.
| | |
|---|---|
| *H01L 23/58* | (2006.01) |
| *H02J 7/00* | (2006.01) |
| *G06F 1/3203* | (2019.01) |
| *H01L 23/34* | (2006.01) |
| *H01L 25/065* | (2023.01) |
| *G06F 1/30* | (2006.01) |

(52) U.S. Cl.
CPC ............ *H02J 7/0068* (2013.01); *G06F 1/30* (2013.01); *G06F 1/3203* (2013.01); *H01L 23/34* (2013.01); *H01L 25/0657* (2013.01); *H01L 2225/06565* (2013.01)

(58) Field of Classification Search
CPC .......... H01L 2225/06565; H02J 7/0042; H02J 7/0068
USPC ........................................................ 713/340
See application file for complete search history.

(56) References Cited

U.S. PATENT DOCUMENTS

| | | | |
|---|---|---|---|
| 5,940,852 A | 8/1999 | Rangasayee et al. | |
| 5,959,881 A * | 9/1999 | Trimberger | H03K 19/17758 365/182 |
| 6,029,236 A | 2/2000 | Steele et al. | |
| 6,091,262 A * | 7/2000 | New | H03K 19/17704 326/38 |
| 6,263,400 B1 | 7/2001 | Rangasayee et al. | |
| 6,441,641 B1 | 8/2002 | Pang et al. | |
| 6,717,436 B2 * | 4/2004 | Kress | H03K 19/17752 326/38 |
| 6,894,527 B1 | 5/2005 | Donlin et al. | |
| 6,931,543 B1 | 8/2005 | Pang et al. | |
| 7,084,487 B1 | 8/2006 | Conn | |
| 7,117,373 B1 | 10/2006 | Trimberger et al. | |
| 7,126,214 B2 | 10/2006 | Huppenthal et al. | |
| 7,242,218 B2 | 7/2007 | Camarota et al. | |
| 7,429,926 B1 | 9/2008 | Drimer | |
| 7,755,946 B2 | 7/2010 | Dunga et al. | |
| 7,864,620 B1 * | 1/2011 | Pedersen | G11C 7/1006 365/189.16 |
| 9,779,016 B1 | 10/2017 | Shen et al. | |
| 10,594,356 B1 | 3/2020 | Halim et al. | |
| 10,802,735 B1 * | 10/2020 | Guzy | G06F 3/0632 |
| 11,043,480 B1 | 6/2021 | Jain et al. | |
| 11,232,360 B1 * | 1/2022 | Nama | G06N 3/04 |
| 11,457,143 B2 | 9/2022 | Seta | |
| 2001/0015919 A1 | 8/2001 | Kean | |
| 2001/0021217 A1 | 9/2001 | Gunther et al. | |
| 2003/0102495 A1 | 6/2003 | Huppenthal et al. | |
| 2004/0000928 A1 * | 1/2004 | Cheng | H03K 19/17728 326/41 |
| 2004/0104709 A1 | 6/2004 | Yamaji et al. | |
| 2004/0177237 A1 * | 9/2004 | Huppenthal | H01L 25/18 712/226 |
| 2005/0059377 A1 | 3/2005 | Schucker et al. | |
| 2005/0237083 A1 * | 10/2005 | Bakker | G06F 1/08 326/47 |
| 2005/0242836 A1 | 11/2005 | Goetting et al. | |
| 2006/0001137 A1 | 1/2006 | Hundt et al. | |
| 2006/0059345 A1 | 3/2006 | Fayad et al. | |
| 2007/0094534 A1 * | 4/2007 | Andreev | G06F 11/261 714/6.13 |
| 2007/0288765 A1 | 12/2007 | Kean | |
| 2008/0272803 A1 | 11/2008 | Balasubramanian et al. | |
| 2008/0313397 A1 | 12/2008 | Millman et al. | |
| 2010/0205470 A1 | 8/2010 | Moshayedi et al. | |
| 2012/0039142 A1 | 2/2012 | Pan et al. | |
| 2012/0153566 A1 | 6/2012 | Ito et al. | |
| 2012/0230103 A1 | 9/2012 | Choe et al. | |
| 2013/0067467 A1 | 3/2013 | Aslot et al. | |
| 2014/0140397 A1 * | 5/2014 | Kim | H03K 19/17748 326/38 |
| 2015/0262633 A1 | 9/2015 | Lee | |
| 2016/0036998 A1 * | 2/2016 | Goda | H04N 1/00509 358/1.13 |
| 2016/0057305 A1 * | 2/2016 | Suzuki | H04N 1/00912 358/1.13 |
| 2016/0098561 A1 | 4/2016 | Keller et al. | |
| 2016/0154602 A1 * | 6/2016 | Obayashi | H03K 19/17756 711/170 |
| 2016/0248588 A1 * | 8/2016 | Langhammer | H04L 63/0428 |
| 2016/0253260 A1 | 9/2016 | Koyama | |
| 2016/0321113 A1 * | 11/2016 | Pinto | G06F 9/45558 |
| 2016/0322155 A1 | 11/2016 | Bailey et al. | |
| 2016/0380635 A1 * | 12/2016 | Roberts | G06F 15/7892 326/38 |
| 2017/0123674 A1 | 5/2017 | Mori et al. | |
| 2017/0148504 A1 * | 5/2017 | Saifuddin | G11C 11/4087 |
| 2017/0179096 A1 | 6/2017 | Dang et al. | |
| 2018/0047663 A1 | 2/2018 | Camarota | |
| 2018/0096714 A1 | 4/2018 | Ng et al. | |
| 2018/0143777 A1 * | 5/2018 | Dasu | G06F 3/061 |
| 2018/0261566 A1 | 9/2018 | Babcock et al. | |
| 2018/0335805 A1 | 11/2018 | Charlesworth et al. | |
| 2019/0044517 A1 | 2/2019 | Shumarayev et al. | |
| 2019/0114138 A1 | 4/2019 | Zhang | |
| 2019/0259695 A1 | 8/2019 | Gandhi et al. | |
| 2019/0279093 A1 | 9/2019 | Woo et al. | |
| 2019/0319364 A1 | 10/2019 | Yang et al. | |
| 2019/0349848 A1 | 11/2019 | Bali | |
| 2020/0065263 A1 | 2/2020 | Liff et al. | |
| 2020/0105774 A1 | 4/2020 | Penumatcha et al. | |
| 2020/0117261 A1 * | 4/2020 | Piwonka | G06F 1/30 |
| 2020/0133649 A1 | 4/2020 | Dorairaj | |
| 2020/0174783 A1 * | 6/2020 | Yamada | G06F 30/34 |
| 2021/0028539 A1 | 1/2021 | We et al. | |
| 2021/0200839 A1 * | 7/2021 | Cech | G06F 21/6281 |
| 2021/0204027 A1 * | 7/2021 | Fan | H04N 21/6143 |
| 2021/0257492 A1 | 8/2021 | Lilak et al. | |
| 2021/0406178 A1 * | 12/2021 | Enrici | G06F 15/76 |

FOREIGN PATENT DOCUMENTS

| | | |
|---|---|---|
| CN | 102160119 A | 8/2011 |
| CN | 103252783 A | 8/2013 |
| CN | 103824580 A | 5/2014 |
| CN | 103904748 A | 7/2014 |
| EP | 3324298 A1 | 5/2018 |
| GB | 2387003 A | 10/2003 |
| JP | H09-232433 | 9/1997 |
| JP | 2000-284945 | 10/2000 |
| JP | 2003-223937 A | 8/2003 |
| JP | 2005-110443 A | 4/2005 |
| JP | 2005-512229 A | 4/2005 |
| JP | 2007-502014 | 2/2007 |

(56) References Cited

FOREIGN PATENT DOCUMENTS

| KR | 10-2004-0072645 A | 8/2004 |
| KR | 10-2013-0134044 A | 12/2013 |
| WO | 03/050694 | 6/2003 |
| WO | 2015183404 A1 | 12/2015 |
| WO | 2016209406 A1 | 12/2016 |
| WO | 2020116046 A1 | 6/2020 |

OTHER PUBLICATIONS

International Patent Application No. PCT/US2020/029010, International Search Report and Written Opinion dated Jul. 21, 2020, 7 pages.

International Patent Application No. PCT/US2021/037502, International Search Report and Written Opinion dated Aug. 31, 2021, 8 pages.

Lyke, James C., et al., "An Introduction to Reconfigurable Systems", Proceedings of the IEEE, vol. 103, No. 3, Mar. 2015, retrieved on [Aug. 15, 2021], retrieved from the internet <URL: https://ieeexplore.ieee.org/stamp/stamp.jsp?tp=&arnumber=7086420>, 27 pages.

* cited by examiner

SYSTEMS AND METHODS FOR RECONFIGURING DUAL-FUNCTION CELL ARRAYS

PRIORITY CLAIMS

The present application is a continuation of U.S. patent application Ser. No. 17/374,754 filed on Jul. 13, 2021 and entitled "Systems and Methods for Reconfiguring Dual-Function Cell Arrays," which is a continuation of U.S. patent application Ser. No. 17/028,165 filed on Sep. 22, 2020 and entitled "Systems and Methods for Integrating Batteries with Stacked Integrated Circuit Die Elements," now U.S. Pat. No. 11,061,455, which is a continuation of U.S. patent application Ser. No. 16/810,790 filed on Mar. 5, 2020 and entitled "Systems and Methods for Integrating Batteries with Stacked Integrated Circuit Die Elements," now U.S. Pat. No. 10,782,759, which claims the benefit of U.S. Provisional Patent Application Ser. No. 62/837,704, filed Apr. 23, 2019 and entitled "Reconfigurable Processor Module Comprising Hybrid Stacked Integrated Circuit Die Elements," and U.S. Provisional Patent Application Ser. No. 62/850,996, filed May 21, 2019 and entitled "Integrating Battery with 3D Die-Stacking Elements," each of which are hereby incorporated by reference herein.

The present application is a continuation of U.S. patent application Ser. No. 17/374,754 filed on Jul. 13, 2021 and entitled "Systems and Methods for Reconfiguring Dual-Function Cell Arrays," which is a continuation of U.S. patent application Ser. No. 17/028,165 filed on Sep. 22, 2020 and entitled "Systems and Methods for Integrating Batteries with Stacked Integrated Circuit Die Elements," now U.S. Pat. No. 11,061,455, which is a continuation of U.S. patent application Ser. No. 16/810,790 filed on Mar. 5, 2020 and entitled "Systems and Methods for Integrating Batteries with Stacked Integrated Circuit Die Elements," now U.S. Pat. No. 10,782,759, which is a continuation-in-part of U.S. patent application Ser. No. 16/777,554 filed on Jan. 30, 2020 and entitled "Systems and Methods for Reconfiguring Dual-Function Cell Arrays," now abandoned, which claims the benefit of U.S. Provisional Patent Application No. 62/837,704 filed on Apr. 23, 2019 and entitled "Reconfigurable Processor Module Comprising Hybrid Stacked Integrated Circuit Die Elements," and U.S. Provisional Patent Application No. 62/850,996 filed on May 21, 2019 and entitled "Integrating Battery with 3D Die-Stacking Elements," each of which are hereby incorporated by reference herein.

The present application is a continuation of U.S. patent application Ser. No. 17/374,754 filed on Jul. 13, 2021 and entitled "Systems and Methods for Reconfiguring Dual-Function Cell Arrays," now U.S. Pat. No. 11,435,800, which is a continuation of U.S. patent application Ser. No. 17/028,165 filed on Sep. 22, 2020 and entitled "Systems and Methods for Integrating Batteries with Stacked Integrated Circuit Die Elements," now U.S. Pat. No. 11,061,455, which is a continuation of U.S. patent application Ser. No. 16/810,790 filed on Mar. 5, 2020 and entitled "Systems and Methods for Integrating Batteries with Stacked Integrated Circuit Die Elements," now U.S. Pat. No. 10,782,759, which is a continuation-in-part of U.S. patent application Ser. No. 16/810,779, filed on Mar. 5, 2020, and entitled "Systems and Methods for Reconfiguring Dual-Function Cell Arrays," now U.S. Pat. No. 10,802,735, which is a continuation-in-part of U.S. patent application Ser. No. 16/777,554, filed Jan. 30, 2020 and entitled "Systems and Methods for Reconfiguring Dual-Function Cell arrays," now abandoned, which claims the benefit of U.S. Provisional Patent Application No. 62/837,704 filed on Apr. 23, 2019 and entitled "Reconfigurable Processor Module Comprising Hybrid Stacked Integrated Circuit Die Elements," and U.S. Provisional Patent Application No. 62/850,996 filed on May 21, 2019 and entitled "Integrating Battery with 3D Die-Stacking Elements," each of which are hereby incorporated by reference herein.

The present application is a continuation of U.S. patent application Ser. No. 17/374,754 filed on Jul. 13, 2021 and entitled "Systems and Methods for Reconfiguring Dual-Function Cell Arrays," which is a continuation of U.S. patent application Ser. No. 17/028,165 filed on Sep. 22, 2020 and entitled "Systems and Methods for Integrating Batteries with Stacked Integrated Circuit Die Elements," now U.S. Pat. No. 11,061,455, which is a continuation of U.S. patent application Ser. No. 16/810,790 filed on Mar. 5, 2020 and entitled "Systems and Methods for Integrating Batteries with Stacked Integrated Circuit Die Elements," now U.S. Pat. No. 10,782,759, which is a continuation-in-part of U.S. patent application Ser. No. 16/788,954 filed Feb. 12, 2020 and entitled "Systems and Methods for Integrating Batteries with Stacked Integrated Circuit Die Elements," now abandoned, which is a continuation-in-part of U.S. patent application Ser. No. 16/777,554 filed on Jan. 30, 2020 and entitled "Systems and Methods for Reconfiguring Dual-Function Cell Arrays," now abandoned, which claims the benefit of U.S. Provisional Patent Application No. 62/837,704 filed on Apr. 23, 2019 and entitled "Reconfigurable Processor Module Comprising Hybrid Stacked Integrated Circuit Die Elements," and U.S. Provisional Patent Application No. 62/850,996 filed on May 21, 2019 and entitled "Integrating Battery with 3D Die-Stacking Elements," each of which are hereby incorporated by reference herein.

TECHNICAL FIELD

This disclosure pertains to batteries for computing systems.

BACKGROUND

Volatile memory requires power to maintain stored data. If power is interrupted, e.g., system power is turned off, the data will be lost. Upon re-instituting powering, the system will need to reload all of the data back into the volatile memory. Reloading the data requires time and processing power, thereby increasing system latency.

SUMMARY

Various embodiments of the present disclosure provide systems and methods including an integrated circuit die substrate. A volatile memory electrically coupled to the integrated circuit die substrate. A first integrated circuit die element electrically coupled to the integrated circuit die substrate, the first integrated circuit die element comprising a first field programmable gate array (FPGA), and the first integrated circuit die element disposed adjacent to the volatile memory. A battery charger operable to receive power from a main power supply, the main power supply having an on state and an off state, wherein the main power supply is supplying power in the on state and not supplying power in the off state. A battery module disposed on a top portion of the first integrated circuit die element, the battery module operable to receive power from the battery charger, and the battery module operable to supply power to the volatile memory at least when the main power supply is in the off state.

In some embodiments, the systems and method further include a second integrated circuit die element stacked with and electrically coupled to the volatile memory.

In some embodiments, the volatile memory comprises a portion of the first integrated circuit die element.

In some embodiments, the second integrated circuit die element comprises a microprocessor.

In some embodiments, the second integrated circuit die element comprises a second FPGA and a corresponding reconfigurable dual function memory array.

In some embodiments, the systems and methods include a third integrated circuit die element stacked with and electrically coupled to the second integrated circuit die element, the third integrated circuit die element comprising any of a microprocessor, additional volatile memory, a second FPGA, or a reconfigurable dual function memory array.

In some embodiments, the systems and methods include a temperature sensor operable to monitor and sense a temperature of at least a portion of the system; and a control logic and microcontroller unit coupled to the temperature sensor, the control logic and microcontroller unit operable to disable, based on the sensed temperature, one or more connection circuits, thereby preventing power leakage from the volatile memory while allowing the volatile memory to continue to receive power from the battery module when the main power supply is in the off state.

Various embodiments of the present disclosure provide systems and methods include an integrated circuit die substrate. A volatile memory electrically coupled to the integrated circuit die substrate. A first integrated circuit die element electrically coupled to the integrated circuit die substrate, the first integrated circuit die element disposed adjacent to the volatile memory. A battery charger operable to receive power from a main power supply, the main power supply having an on state and an off state, wherein the main power supply is supplying power in the on state and not supplying power in the off state. A battery module disposed on the integrated circuit die substrate, the battery module operable to receive power from the battery charger, and the battery module operable to supply power to the volatile memory at least when the main power supply is in the off state.

In some embodiments, the systems and methods include a second integrated circuit die element stacked with and electrically coupled to the volatile memory.

In some embodiments, the volatile memory comprises a portion of the first integrated circuit die element.

In some embodiments, the second integrated circuit die element comprises a microprocessor.

In some embodiments, the second integrated circuit die element comprises a second FPGA and a corresponding reconfigurable dual function memory array.

In some embodiments, the systems and methods include a third integrated circuit die element stacked with and electrically coupled to the second integrated circuit die element, the third integrated circuit die element comprising any of a microprocessor, additional volatile memory, a second FPGA, or a reconfigurable dual function memory array.

In some embodiments, the systems and methods include a temperature sensor operable to monitor and sense a temperature of at least a portion of the system; and a control logic and microcontroller unit coupled to the temperature sensor, the control logic and microcontroller unit operable to disable, based on the sensed temperature, one or more connection circuits, thereby preventing power leakage from the volatile memory while allowing the volatile memory to continue to receive power from the battery module when the main power supply is in the off state.

Various embodiments of the present disclosure provide systems and methods configured to receive, by volatile memory, power from a main power supply, the main power supply having an on state and an off state, wherein the main power supply is supplying power in the on state and not supplying power in the off state, the volatile memory being electrically coupled to an integrated circuit die substrate. Receive, by a battery charger, power from the main power supply, the battery charger being disposed on a top portion of a first integrated circuit die element electrically coupled to the integrated circuit die substrate and comprising a first field programmable gate array (FPGA), and the first integrated circuit die element being disposed adjacent to the volatile memory. Receive, by a battery, power from the battery charger. Receive, by the volatile memory, power from the battery charger. Detect, by a control logic and microcontroller unit, a power output of the main power supply indicative of the main power supply being in the off state. Disable, in response to detecting the power output indicative of the main power suppling being in the off state, a first connection circuit between the main power supply and the volatile memory, thereby preventing power leakage from the volatile memory while allowing the volatile memory to continue to receive power from the battery.

In some embodiments, the volatile memory is electrically coupled to and stacked with a second integrated circuit die element.

In some embodiments, the volatile memory comprises a portion of the first integrated circuit die element.

In some embodiments, the second integrated circuit die element comprises a microprocessor.

In some embodiments, the second integrated circuit die element comprises a second FPGA and a corresponding reconfigurable dual function memory array.

In some embodiments, the second integrated circuit die element is electrically coupled to and stacked with a third integrated circuit die element, the third integrated circuit die element comprising any of a microprocessor, additional volatile memory, a second FPGA, or a reconfigurable dual function memory array.

These and other features of the systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

DETAILED DESCRIPTION

In various embodiments, a computing system integrating a battery with a die-stacking package including volatile memory may improve computing system performance. For example, if a main power supply of the computing system goes down (e.g., for scheduled maintenance or during unexpected power outages), the integrated battery may prevent the volatile memory from losing data. When main power is restored, the computing system can avoid reloading memory and/or reloading FPGA configuration information. Accordingly, recovery time for the computing system may be faster (e.g., 100 times faster) and may use less energy than recoveries involving volatile memory data loss. The integrated battery may also stabilize power levels to the die stacking package, isolate noisy power elements, and provide improved signal quality.

In some embodiments, the computing system also includes a temperature sensor. The temperature sensor may sense temperatures of the computing system and/or portions thereof (e.g., the integrated battery, the die stacking package, the volatile memory, and/or the like). If a temperature exceeds a threshold temperature, the computing system may perform one or more actions to protect against damage to system components. For example, the computing system may disable the battery, shutdown the die stacking package, and/or the like. Once temperatures return to a normal operational level, the computing system may be restored.

Figure 1:
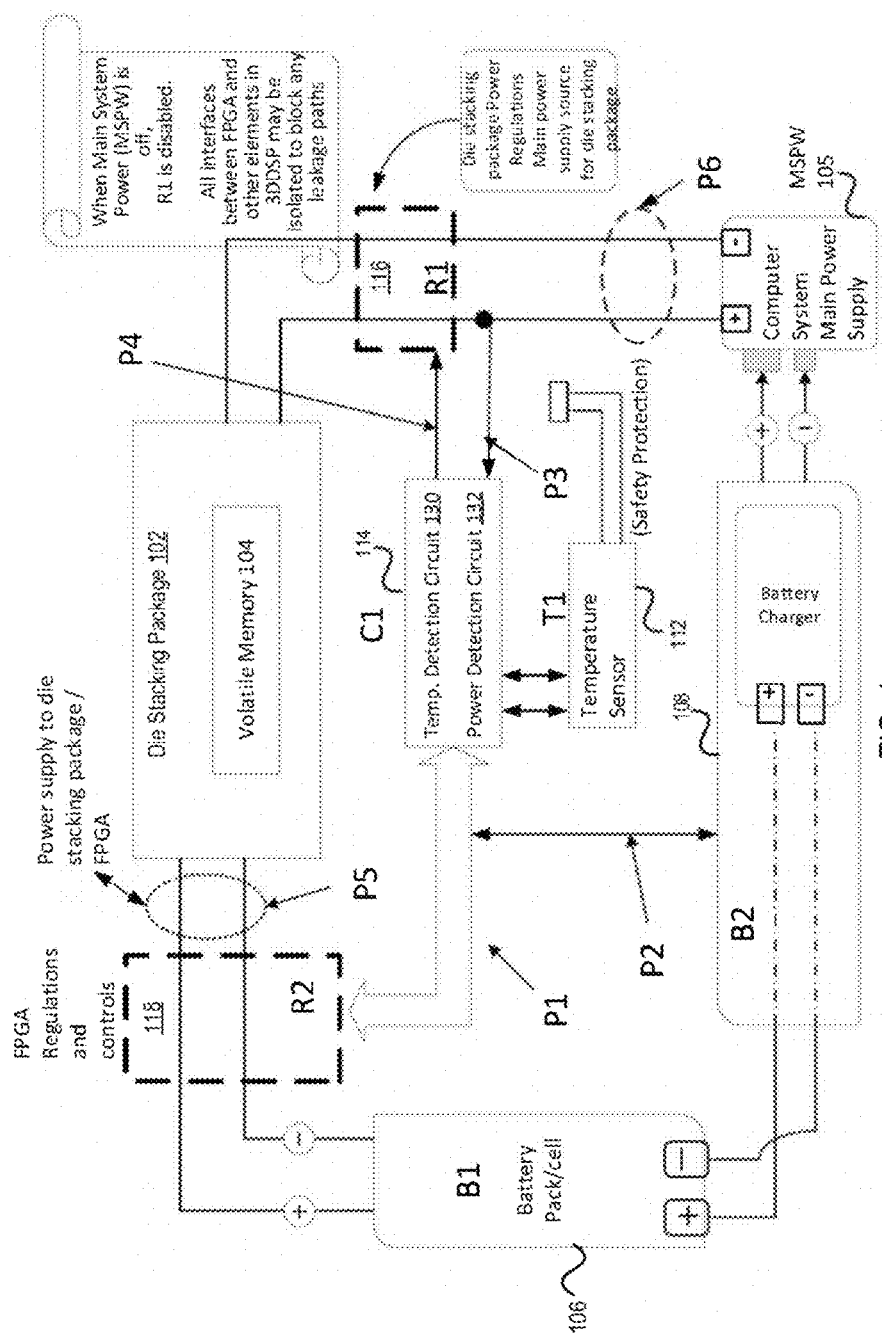
FIG. 1 is a block diagram of a processing system including an integrated battery for providing power to volatile memory of a die stacking package according to some embodiments.

FIG. 1 is a block diagram of a processing system 100 including an integrated battery 106 configured to provide power to volatile memory 104 of a die stacking package 102 according to some embodiments. In the example of FIG. 1, the processing system 100 includes the die stacking package 102 with the volatile memory 104, a main power supply 105, the integrated battery (or simply "battery") 106, a battery charger 108, a temperature sensor circuit 112, a control logic and microcontroller unit 114, and connection circuits 116 and 118.

Figure 2:
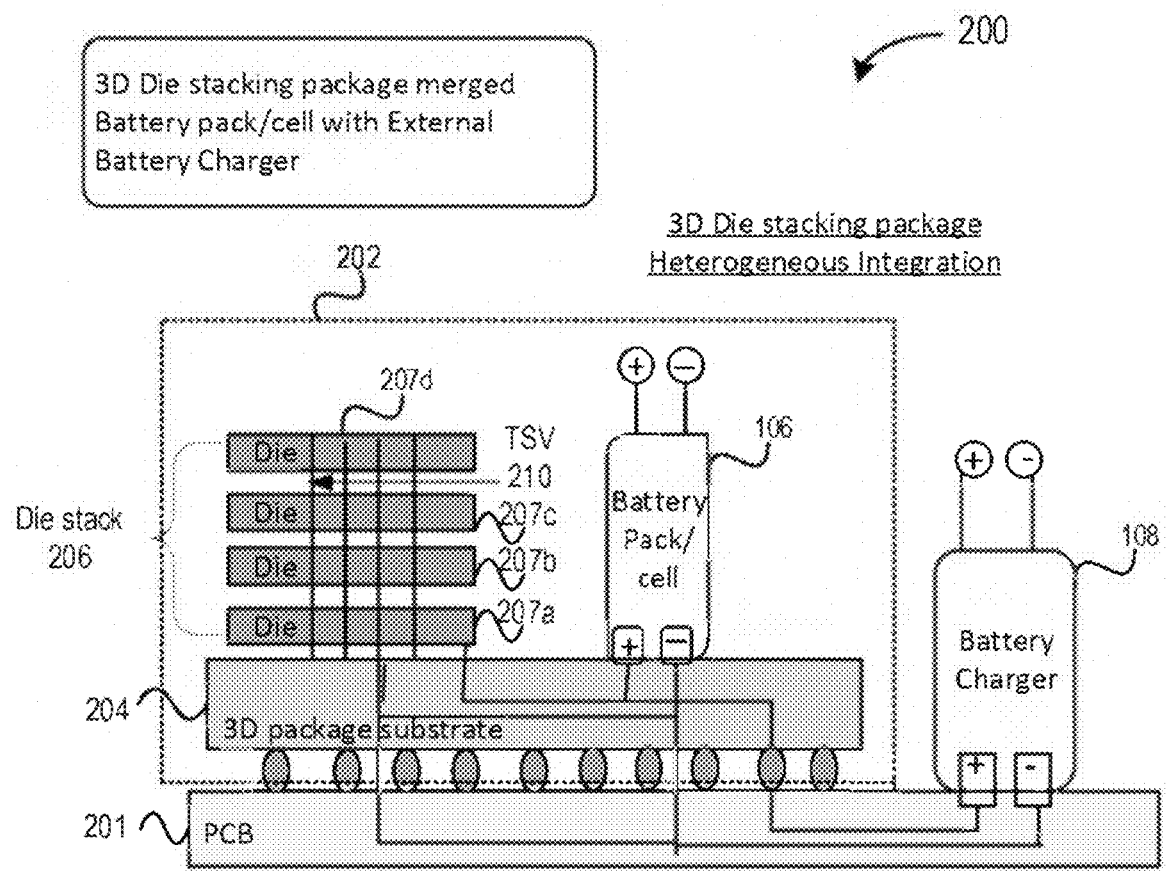
FIG. 2 is a block diagram of a processing system including a battery integrated with a die stacking package according to some embodiments.
Figure 3:
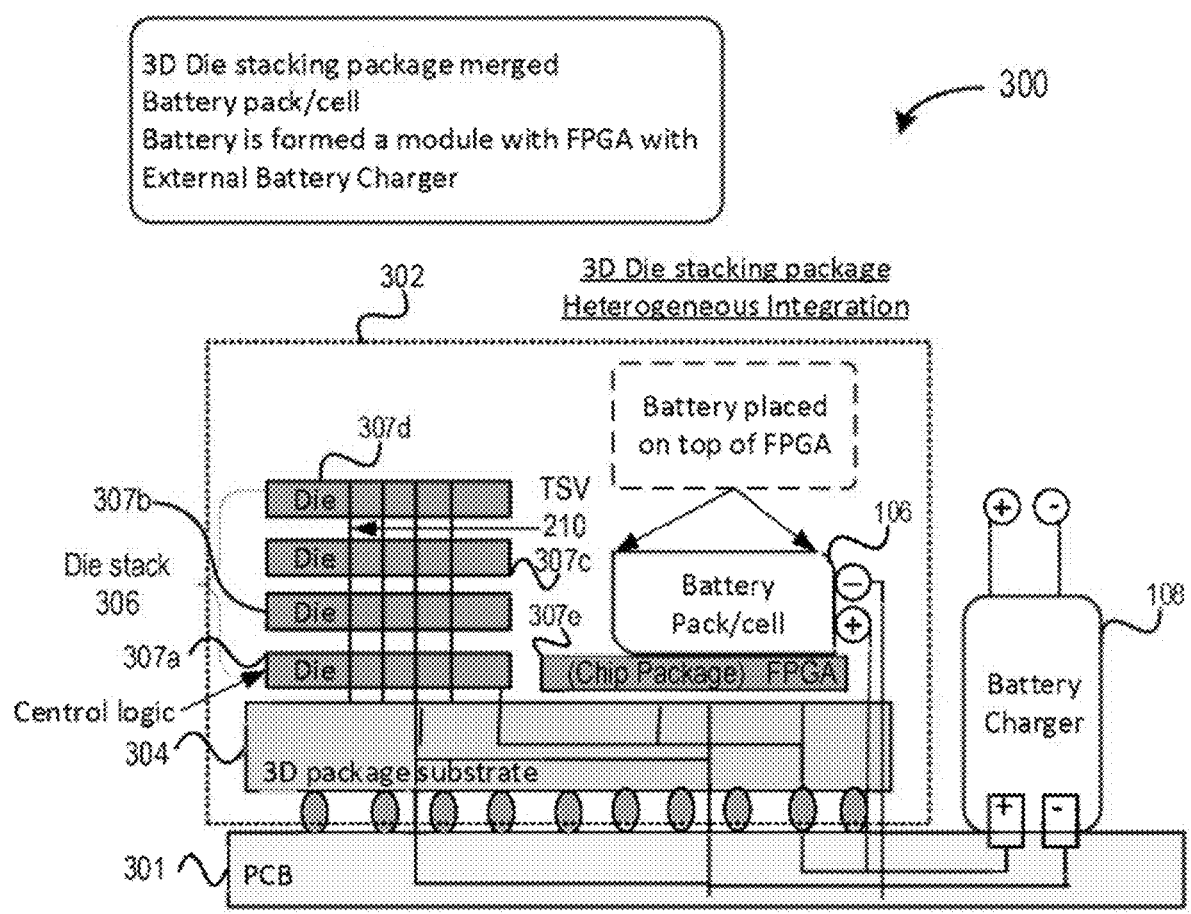
FIG. 3 is a block diagram of a processing system including a battery integrated with a die stacking package according to some embodiments.
Figure 5:
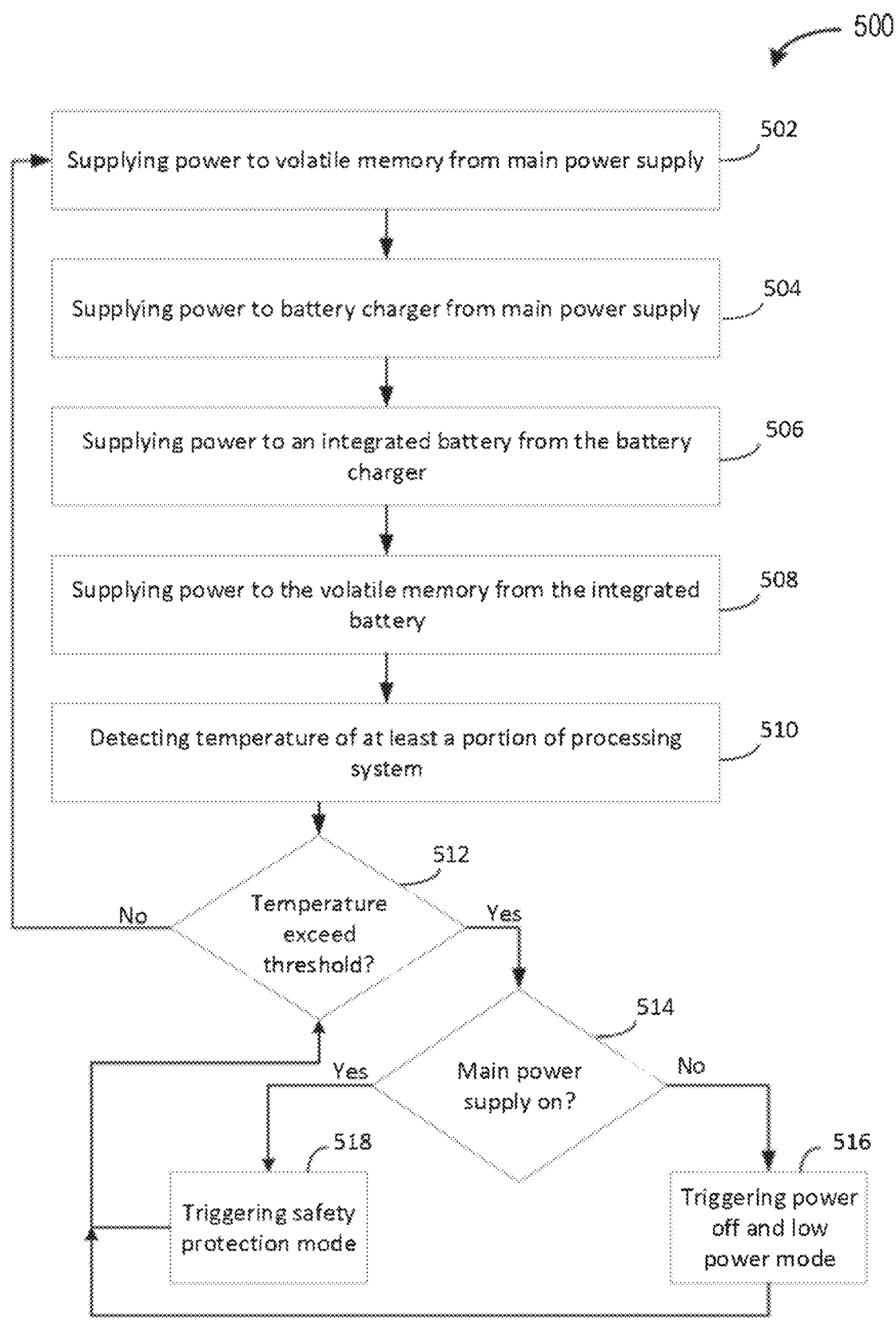
FIG. 5 is a flowchart of a method of operation of a processing system including temperature sensor and a battery integrated with a die stacking package according to some embodiments.

The die stacking package 102 includes a stack of integrated circuit die elements and volatile memory 106. The die stacking package 102 may include a stack of one or more microprocessors, field programmable gate arrays (FPGAs), and/or the volatile memory 106. The die stacking package 102 may provide significant acceleration in the sharing of data between a microprocessor and an FPGA. Example die stacking packages 102 are shown in FIGS. 2 and 3. An example die stacking package, albeit without support for an integrated battery, is described in U.S. Pat. No. 6,627,985. In some embodiments, the die stacking package 102 may include reconfigurable dual-function cell arrays (e.g., as shown in FIG. 5).

In some embodiments, the die stacking package 102 has three primary elements, namely, DRAM, an FPGA (Logic Unit) to allow the die stacking package 102 to create a re-configurable processor, and a microprocessor (or master processor). Each primary element may be implemented on a die of the die stacking package 102. All three primary elements are volatile. Accordingly, once the processing system 100 is powered off, the die stacking package's 102 data stored in memory 104 and the FPGA configuration information is lost. In a system without an integrated battery 106, upon powering up again, the processing system 100 would need to reload all of the data back to the memory 104 and reload the FPGA configuration information. Reloading the memory and/or the FPGA configurations (e.g., from the onboard series-flash memory) can take a long period of time, thereby increasing system latency.

The volatile memory 104 comprises memory that requires power to maintain stored data. The volatile memory 104 retains the stored data while power is being supplied to the volatile memory 104, but if power is interrupted, the stored data is lost. For example, the volatile memory 104 may include DRAM, SRAM, and/or other volatile memory.

The main power supply 105 may function to supply power to the processing system 100. The main power supply 105 may convert electric current from a source to the correct voltage, current, and frequency to power a load. The main power supply 110 may convert AC power to low-voltage regulated DC power for components of the processing system 110. For example, the main power supply 105 may be a power supply unit of a computer (e.g., desktop computer, server). In some embodiments, the main power supply 105 may be a power supply of a mobile device. For example, the main power supply 105 may be the primary battery a mobile device (e.g., an iPhone).

In some embodiments, the main power supply 105 may have an on state, an off state, and low power state (e.g., sleep state). While in the on state the main power supply 105 is supplying power, and while in the off state the main power supply 105 is not supplying power (or at least not supplying sufficient power to the volatile memory 104 for the volatile memory 104 to prevent memory loss). The off state may be triggered, for example, in response to an unexpected event (e.g., a power outage) or a scheduled event (e.g., a scheduled maintenance). While in a sleep state, the main power supply 105 may be providing reduced power than while in the on state and may be directing that power to certain components not including the volatile memory 104. Accordingly, particular operations may be suspended.

The battery 106 may function to supply power to the die stacking package 102. For example, the battery 106 may supply at least enough voltage sufficient for the volatile memory 104 to retain data stored in the volatile memory 104 and/or an FPGA to retain configuration information. In some embodiments, the battery 106 may comprise a lithium cell battery. The battery 106 may be integrated with the die-stacking package 102 for heterogeneous integration (e.g., as shown in FIGS. 2 and 3). The battery 106 may be charged from power supplied by the battery charger 108. The battery charger 108 may be charged by receiving power supplied by the main power supply 105.

In some embodiments, the battery 106 may function as a backup power supply (e.g., a backup for the main power supply 105). For example, if the main power supply 105 is in the off state, the battery 106 may still provide enough power to the die stacking package 102 for the volatile memory 104 to retain the data stored therein. The battery 106 may also maintain the CMOS FPGA silicon's configuration data of the die stacking package 102 when main power supply 105 is off.

In some embodiments, when the die stacking package 102 is in a normal operation mode, the battery 106 may provide the power to the die stacking package 102 to maintain proper power distribution and/or isolate power glitches generated from external components, including glitches from the main power supply 105.

In some embodiments, when the main power supply 105 is in a sleep state (or low power mode), connected devices (e.g., Internet-of-Things devices) may be in a low-power mode (sleep mode). When the connected devices wake, they may have timing requirements to execute a task. The battery 106 may provide sufficient power for the connected devices to wake to complete a given task of a given application, thereby meeting the timing requirements to execute the task.

In some embodiments, the battery 106 may be disposed within close proximity to the die stacking package's 102 power supply source. A lithium-cell battery design may provide a fast charge, and may be generated from an arbitrarily shaped cell (physical dimension design), and may offer battery safety protection. Current Li-on battery manufacturers are capable of manufacturing small dimensional and arbitrarily shaped cells for die stacking packages. Arbitrarily shaped cells may allow, for example, stacking the battery on top of a die stacking package (e.g., as shown in FIG. 3) and/or on the side of the die stacking package (e.g., as shown in FIG. 2).

The temperature sensor circuit 112 may function to monitor and/or sense (or detect) temperatures of the processing system 100 and/or portions thereof. For example, the temperature sensor may detect temperatures of the main power supply 105, the battery 106, the battery charger 106, the die stacking package 102, the volatile memory 104, and/or the like.

The control logic and microcontroller unit 114 may function to perform and/or trigger various actions (e.g., to control current/power and to reduce the temperature of the die stacking package 102 to an operational level). For example, the control logic and microcontroller unit 114 may perform actions based on temperatures detected by the temperature sensor circuit 112. In some embodiments, the control logic and microcontroller unit 114 may enable and/or disable components of the processing system 100.

As shown, the control logic and microcontroller unit 114 includes a temperature detection circuit 130 and a power detection circuit 132. The temperature detection circuit 114 may function to receive detected temperature values (e.g., from the temperature sensor) and/or determine whether the detected temperature values exceed a threshold temperature value. For example, the temperature threshold value may correspond to a maximum safe temperature for normal system operation. The power detection circuit 132 may detect a state of the main power supply 105 (e.g., off state, on state, sleep state).

In some embodiments, the control logic and microcontroller unit 114 may function to disable and/or enable the connection circuits 116 and 118. Enabling the connection circuit 116 may allow the die stacking package 102 to receive power from the main power supply 105. Disabling the connection circuit 116 may prevent the die stacking package 102 from receiving power from the main power supply 105, and/or prevent power leakage from the die stacking package 102. Enabling the connection circuit 118 may allow the die stacking package 102 to receive power from the battery 106. Disabling the connection circuit 118 may prevent the die stacking package 102 from receiving power from the battery 106, and/or prevent power leakage from the die stacking package 102.

Normal Operation Mode

In a normal mode of operation, according to some embodiments, the control logic and microcontroller unit 114 enables connection circuits 116 and 118 and the battery charger 118. The die stacking package 102 receives power from the main power supply 105 over electrical path P6. The die stacking package 102 also receives power from the battery 106 over electrical path P6.

Power-Off and Low Power Mode

In a power off state and a low power state (mode), the power detection circuit 132 detects the main power supply 105 is off. The control logic and microcontroller unit 114 enables connection circuit 118 to regulate power/current to the die stacking package 102 and the temperature sensor circuit 112. If the temperature sensor circuit 112 senses a high temperature, then in some embodiments the control logic and microcontroller unit 114 disables the battery charger 108 and reduces current to the die stacking package 102 through connection circuit 118. During low power mode, the die stacking package 102 requires low voltage levels which only need to maintain the volatile memory data and the FPGA's configuration information without changing (e.g., flopping) the data. The FPGA configuration element may be SRAM cells. In some embodiments, the control logic and microcontroller unit 114 sets the die stacking package 102 FPGA I/O pins into tri-state. The FPGA of the die stacking package 102 may not create any DC paths to consume battery power/current. The FPGA's power distribution allows the battery's 106 regulator (connection circuit 118) to supply power to the die stacking package 102 when the processing system 100 operates under low power mode or the main power supply 105 is off. In some embodiments, other components of the processing system 100 do not consume battery power.

Safety Protection Mode

When the temperature detection circuit 130 senses high temperature and the main power supply 105 is in normal mode (e.g., on state), the system may go into a safety protection mode. In some embodiments, to enter safety protection mode, the control logic and microcontroller unit 114 disables the battery charger 108, and disables connection circuits 116 and 118. The allows the processing system 100, and/or components thereof (e.g., die stacking package 102) to cool-down without executing any tasks. By shutting down the die stacking package 102, the processing system 100, and the computing system as a whole, may be protected from damage.

FIG. 2 is a block diagram of a processing system 200 including a battery 106 integrated with a die stacking package 102 according to some embodiments. In the example of FIG. 2, a battery 106 is disposed directly on a package substrate 204 of a die stacking package 202. The die stacking package 202 may include a die stack 206 of integrated circuit die elements 207. Although four integrated circuit die elements 207 are shown here, it will be appreciate that a die stack 206 may include one or more integrated circuit die elements 207. An integrated circuit die element 207 may include a microprocessor, field programmable gate arrays (FPGAs), volatile memory, reconfigurable dual-function cell arrays, and/or the like, and they may be stacked in any configuration. For example, integrated circuit die elements 207 may be stacked on top of each other, next to each other (e.g., as shown in FIG. 3) and/or the like. An example stack configuration is shown in U.S. Pat. No. 6,627,985. An example dual function cell array is shown in U.S. application Ser. No. 16/777,554.

In the example of FIG. 2, the battery 106 supplies power to the die stack 206, and/or one or more integrated circuit die elements 207 of the die stack 206, at least when the main power supply 105 is powered off or in a low power state. In the example of FIG. 2, the battery charger 108 is disposed on the printed circuit board 201.

FIG. 3 is a block diagram of a processing system 300 including a battery 106 integrated with a die stacking package 102 according to some embodiments. In the example of FIG. 3, the die stacking package 302 includes a package substrate 304, a die stack 306, and a battery 106. The battery 106 is disposed on top of the FPGA chip package 307e of the die stack 306. The FPGA chip package 307e is disposed to a side of the integrated circuit die element 306a. Like the other die stacking packages described herein, the die stack 306 may include one or more integrated circuit die elements 307. An integrated circuit die element 207 may include a microprocessor, field programmable gate arrays (FPGAs), volatile memory, reconfigurable dual-function cell arrays, and/or the like, and they may be stacked in any configuration. In some embodiments, the battery 106 supplies power to the FPGA only.

Although not shown, a system could have multiple batteries 106 that cooperate to supply power to a plurality of volatile memories 104. A system could have multiple batteries 106 that each support one or more different volatile memories 104. The batteries can be located adjacent or atop the volatile memory 104 that is supports.

Figure 4A:
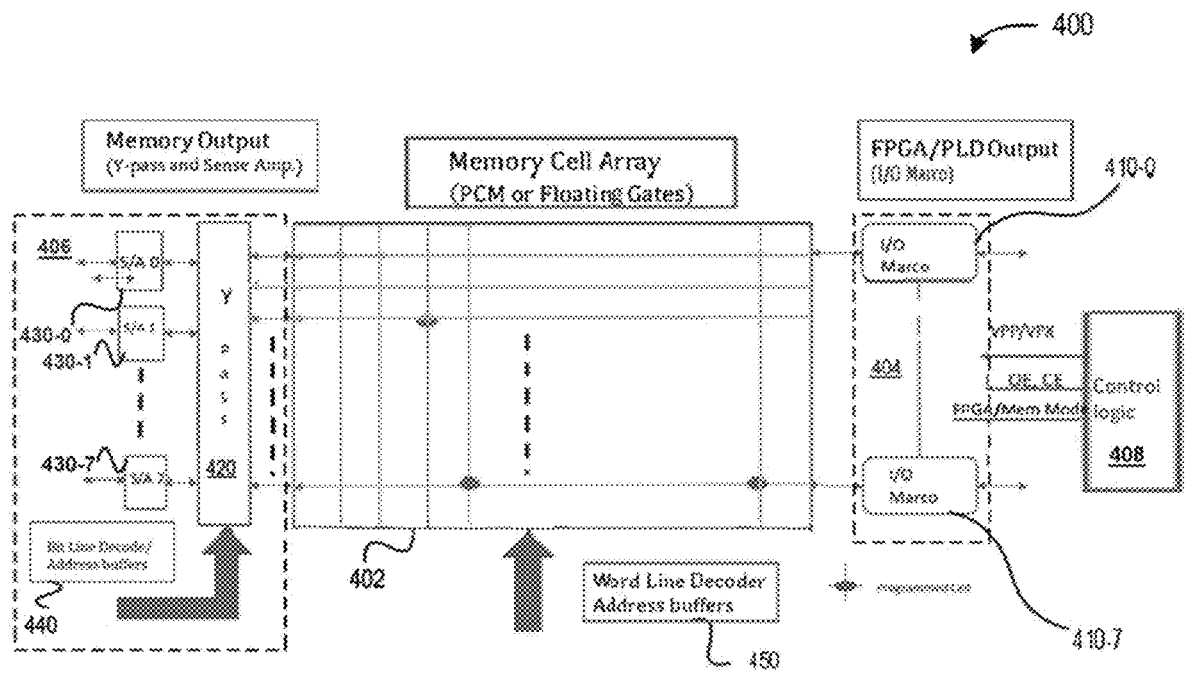
FIG. 4A is a block diagram of a processing system including a reconfigurable dual function cell array according to some embodiments.

FIG. 4A is a block diagram of a processing system 400 including a reconfigurable dual function cell array 402 according to some embodiments. The processing system 400 further includes FPGA elements 404 and storage memory elements 406. In some embodiments, the processing system 400 is implemented on a single integrated circuit die (e.g., of the die stack 206). In other embodiments, the processing system 400 is implemented on multiple integrated circuit dies. For example, the reconfigurable dual-function cell array 402, the FPGA circuitry 404, and/or the storage memory circuitry 406 may be implemented across multiple integrated circuit dies. The processing system 400 further includes control logic 408 that functions to configure the various cells of the reconfigurable dual-function cell array 402 as a memory array or as a logic array.

The reconfigurable dual-function function cell array 402 includes one or more arrays (e.g., a single array or a matrix of arrays) of programmable cells that can be reconfigured to function either as control memory cells for the FPGA elements 404 or as storage memory cells for the memory elements 406. As indicated above, the programmable cells may be non-volatile memory cells or volatile memory cells. The storage memory cells may function as fast access memory cells (e.g., cache), and the control memory cells may function as configuration data for configuring an FPGA. For example, the configuration data stored in the control memory cells can be used to configure the FPGA elements 404 to perform complex combinational functions, and/or relatively simple logic gates (e.g., AND, XOR). In some embodiments, both logic and memory cells can be created on the same reconfigurable dual-function cell array 402.

Any number of such reconfigurable dual-function function cell arrays 402 may be included in the processing system 400. In some embodiments, the processing system 400 can configure programmable cells of one reconfigurable dual-function function cell array 402 to function as a memory array, and configure programmable cells of another reconfigurable dual-function function cell array 402 to function as a logic array. If, for example, more memory is needed for a particular application, the processing system may reconfigure a logic array to function as a memory array. If, for example, more logic is needed for a particular application, the processing system may reconfigure a memory array to function as a logic array. Since memory and logic functionality may be increased or decreased as needed, use of external memory may be avoided. This can improve system performance and/or consume less energy than traditional systems.

The FPGA elements 404 comprise circuitry configured to provide functionality of an FPGA and/or programmable logic device (PLD). The FPGA elements 404 include I/O macro circuits 410-0 to 410-1. The I/O macro circuits 410 function to provide complex combinational functions, and/or relatively simple logic gates (e.g., AND, XOR). Although eight I/O macro circuits 410 are shown here, there may be any number of such circuits (e.g., based on the number of rows/columns in the reconfigurable dual-function cell array 402).

The control logic 408 functions to configure (e.g., program) the memory cells of the reconfigurable dual-function cell array 402 as either storage memory cells or control memory cells. Configuration may occur after manufacturing (e.g., in the field). For example, various applications may have different storage memory and/or logic requirements. The control logic circuit 408 may configure, either automatically or in response to user input, the cells of the reconfigurable dual-function cell array 402 based on the requirements. As requirements change, cells may be once again be reconfigured. In some embodiments, individual cells of the reconfigurable dual-function cell array 402 may have a default configuration as a storage memory cells or a control memory cells. In some embodiments, a default configuration may be a null configuration, and may be reconfigured to either an storage memory cell or control memory cell.

The storage memory elements 406 comprise circuitry for memory operations, e.g., a read and/or write. The storage memory elements 406 include a Y-pass circuit 430 and sense amplifiers 430-0 to 430-7. Although eight sense amplifiers 430 are shown here (one sense amplifier 430 for each column of cells of the reconfigurable dual-function cell array 402), it will be appreciated that any appropriate number of number of sense amplifiers 430 (e.g., based on the number of columns in the reconfigurable dual-function cell array 402) may be used. Generally, a sense amplifier 430 comprises circuitry for reading data from the reconfigurable dual-function cell array 402 (e.g., from the cells programmed as storage memory cells). The sense amplifiers 430 function to sense low power signals from a bitline of the reconfigurable dual-function cell array 402 that represents a data bit (e.g., 1 or 0) stored in a storage memory cell, and amplify the small voltage swing to recognizable logic levels so the data can be interpreted properly by logic outside the reconfigurable dual-function cell array 402.

In some embodiments, a processing system 400 including a matrix of reconfigurable dual-function function cell arrays may be implemented on a single integrated circuit die. The single integrated circuit die may be used independently of other integrated circuit dies and/or be stacked with other integrated circuit dies (e.g., a microprocessor die, a memory die, an FPGA die) in various configurations to further improve performance. For example, a stack may include any combination of layers. Layers may each be a single die. One layer may include the processing system 400 and another layer may include a microprocessor die.

Storage Memory Mode

In a storage memory mode of operation, the control logic circuit 408 sets a configuration value to memory mode (e.g., "low") to configure at least a block (e.g., a sub-array) of the reconfigurable dual-function cell array 402 as storage memory. In some embodiments, the storage memory mode disables the FPGA functions (e.g., output functions of the FPGA elements 404). Bit line decoders/address buffers 440, word line decoders/address buffers 450 and/or Y-pass 420 address cells or rows of cells. Data is transferred in or out of the memory cells. The sense amplifiers 420 connect to internal or external wiring channels.

FPGA Mode

In an FPGA mode of operation, the control logic circuit 408 sets a configuration value to logic mode (e.g., "high") to configure at least a portion of the reconfigurable dual-function cell array 402 for performing logic functions. In some embodiments, the FPGA mode disables memory circuit 406 and enables FPGA elements 404. Address buffers may supply the address to the reconfigurable dual-function cell array 402 to perform the logic function. The output of the reconfigurable dual-function cell array 402 (e.g., an AND-OR array) connects to I/O macro circuits 410. The I/O macro circuits 410 receive the configuration data from the logic arrays. The configuration data configures the I/O macro circuits 410 to generate results based on the configuration data.

Figure 4B:
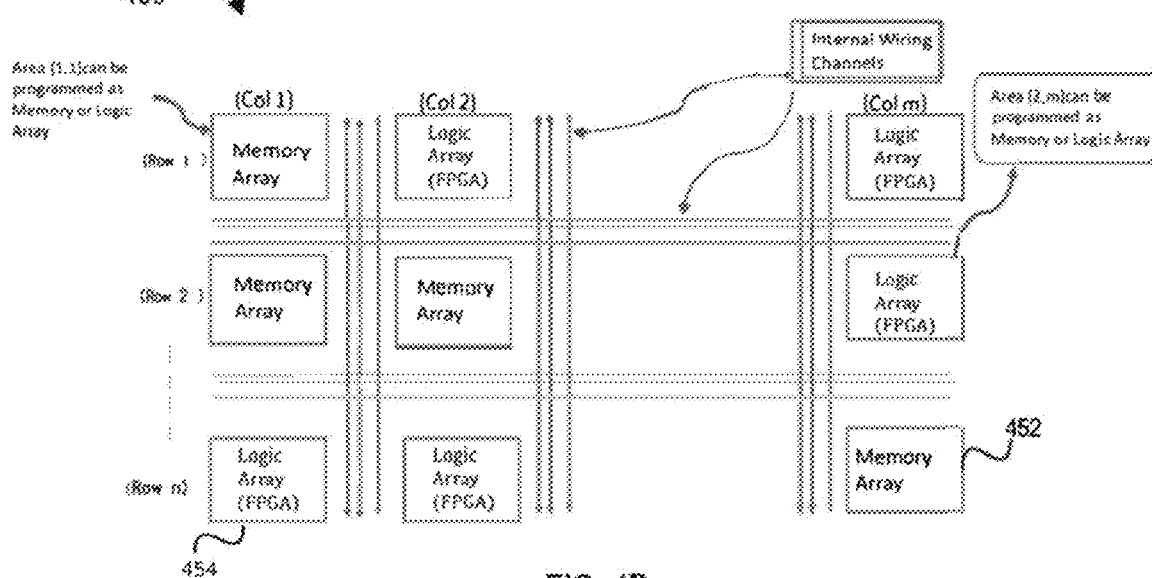
FIG. 4B is a block diagram of a matrix of reconfigurable dual function cell arrays according to some embodiments.

FIG. 4B is a block diagram of a matrix 200 of reconfigurable dual function cell arrays 402 according to some embodiments. The matrix 200 includes storage memory and logic arrays. As shown, some arrays may be programmed as storage memory arrays and some arrays may be programmed as logic arrays. When a design or application requires more storage memory arrays, the storage memory array can be reconfigured (e.g., reprogrammed) from a logic memory array into a storage memory array. When a design or application requires more logic arrays, the storage memory array can be reconfigured (e.g., reprogrammed) from a storage memory array into a logic array. This approach can increase the efficacy of memory arrays usage and can reduce energy consumption.

In the example of FIG. 4B, the matrix 450 includes a storage memory array 454 at area n,m and a logic array at area n,1 of the matrix 450. The processing system 400 can reconfigure any of the arrays. For example, the processing system 400 can reconfigure the storage memory array 353 at area n,m to be a logic array.

FIG. 5 depicts a flowchart of a method 500 of providing power to volatile memory (e.g., volatile memory 104) from an integrated battery (e.g., battery 106) according to some embodiments. In this and other flowcharts and/or sequence diagrams, the flowchart illustrates by way of example a sequence of steps. It should be understood the steps may be reorganized for parallel execution, or reordered, as applicable. Moreover, some steps that could have been included may have been removed to avoid obscuring the invention and for the sake of clarity and some steps that were included could be removed, but may have been included for the sake of illustrative clarity.

In step 502, a main power supply (e.g., main power supply 105) supplies power to a volatile memory (e.g., volatile memory 104) of a die stacking package (e.g., die stacking package 102, 202, or 302). For example, the volatile memory may be a memory die of a die stack (e.g., die stack 206 or 306).

In step 504, the main power supply supplies power to a battery charger (e.g., battery charger 108). In step 506, the battery charger supplies power to an integrated battery (e.g., battery 106). In step 508, the integrated battery supplies power to the volatile memory.

In step 510, a temperature sensor (e.g., temperature sensor circuit 112) detects one or more temperatures of at least a portion of a processing system (e.g., processing system 100, processing system 200, or processing system 300). For example, the temperature sensor may detect an overall temperature the processing system 100, or temperature(s) for the battery, battery charger, die stacking package, main power supply, and/or the like.

In step 512, if the detected temperature exceeds a threshold temperature value, a control logic and microcontroller unit (e.g., control logic and microcontroller unit 114) detects whether the main power supply is on (step 514). For example, a temperature detection circuit (e.g., temperature detection circuit 130) may determine if the senses temperature exceeds the threshold, and a power detection circuit (e.g., power detection circuit 132) may detect whether the main power supply is off. If the main power supply is off, the control logic and microcontroller unit triggers a power off and safety low power mode (step 516). If the power is on, the control logic and microcontroller unit triggers a safety protection mode (step 518). In some embodiments, step 512 does not happen and there exists only a single safety protection mode.

In the power off and safety low power mode, the control logic and microcontroller unit may perform one or more actions to reduce the temperature in order to prevent system damage. For example, the control logic and microcontroller unit may disable the battery charger. The control logic and microcontroller unit may reduce the current through connection circuit R2 (e.g., connection circuit 118) to just enough power for the volatile memory to retain the memory contents. The control logic and microcontroller unit may block all current through connection circuit R2 (e.g., connection circuit 118). After the processing system cools down sufficiently to resume a normal mode of operation, the method may re-enable the battery charger and may return connections to fully operational states. In some embodiments, the system may perform a hierarchical safety response, e.g., first stop the battery charger. If it is not sufficient, then the system may disconnect the battery. For example, the control logic and microcontroller unit may shutdown and isolate the die stack by disable a second connection circuit R1 (e.g., connection circuit 116).

In the safety protection mode, the control logic and microcontroller unit may disable battery, the battery charger and both connection circuits R1 and R2. In some embodiments, the system may perform a hierarchical safety response, e.g., first stop the power supply, if insufficient then stop the battery charger, and if insufficient then stop the battery. Alternatively, the hierarchical safety response may first stop the power supply and the battery charger and if insufficient then stop the battery. Although the contents of the volatile memory will be lost, this may help prevent damage to the components of the processing system.

The method 500 may return to step 510. If the temperature still exceeds the threshold, the control logic and microcontroller unit may perform additional remedial measures. If the system has cooled sufficiently (e.g., the temperature no longer exceeds the threshold temperature value), the control logic and microcontroller unit may return to the processing system to a normal mode of operation (e.g., at step 502).

Figure 6:
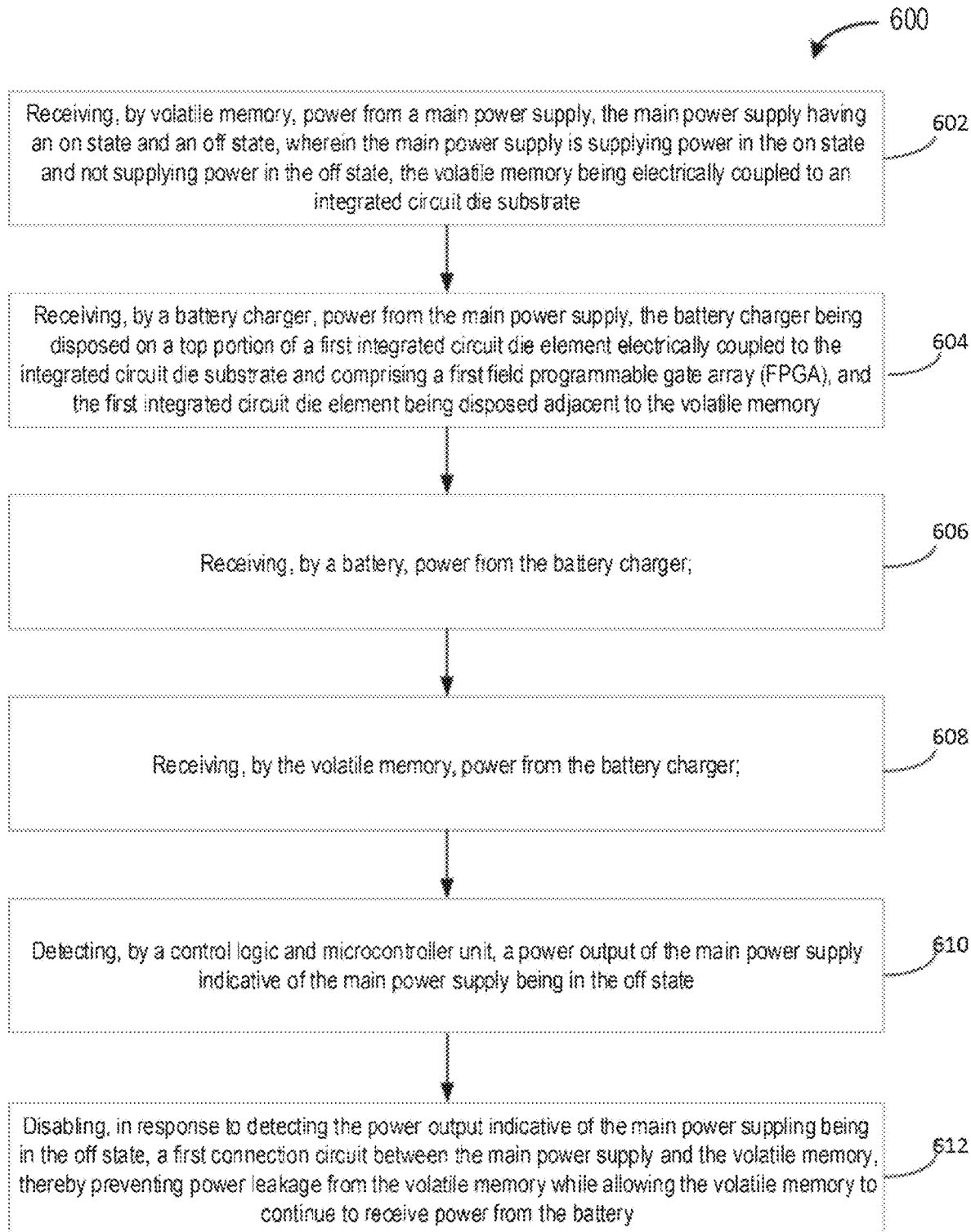
FIG. 6 is a flowchart of a method of providing power to volatile memory of a die stacking package using an integrated battery according to some embodiments.

FIG. 6 is a flowchart of a method 600 of providing power to volatile memory (e.g., volatile memory of a die stacking package using an integrated battery according to some embodiments.

In step 602, a volatile memory (e.g., volatile memory 104) receives power from a main power supply. The main power supply may have an on state and an off state. The main power supply supplies power in the on state and does not supply power in the off state. The volatile memory may be electrically coupled to an integrated circuit die substrate (e.g., substrate 204 or 304);

In step 604, a battery charger (e.g., battery charger 108) receives power from the main power supply, the battery charger being disposed on a top portion of a first integrated circuit die element electrically coupled to the integrated circuit die substrate and comprising a first field programmable gate array (FPGA), and the first integrated circuit die element being disposed adjacent to the volatile memory;

In step 606, an integrated battery (e.g., battery 106) receives power from the battery charger. In step 608, the volatile memory receives power from the battery charger. In step 610, a control logic and microcontroller unit (e.g., control logic and microcontroller unit 114) detects a power output of the main power supply indicative of the main power supply being in the off state.

In step 612, the control logic and microcontroller unit disables, in response to detecting the power output indicative of the main power suppling being in the off state, a first connection circuit between the main power supply and the volatile memory, thereby preventing power leakage from the volatile memory while allowing the volatile memory to continue to receive power from the battery (and preserve content of the volatile memory).

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein. It will further be appreciated that the term "or," as used herein, may be construed in either an inclusive or exclusive sense.

The present invention(s) are described above with reference to example embodiments. It will be apparent to those skilled in the art that various modifications may be made and other embodiments may be used without departing from the broader scope of the present invention(s). Therefore, these and other variations upon the example embodiments are intended to be covered by the present invention(s).

The invention claimed is:

1. An integrated circuit die system, comprising:
a microprocessor die element cooperative with cache memory;
a field-programmable gate array (FPGA) die element including one or more FPGA elements, each of the one or more FPGA elements having a configuration based on configuration data;
a reconfigurable dual function memory array die element, the reconfigurable dual function memory array die element including a plurality of reconfigurable memory array portions, each reconfigurable memory array portion being capable of configuration and reconfiguration as a cache memory array portion at one time or as a control logic array portion at a different time, the reconfigurable memory array portion configured to store process data when the reconfigurable memory array portion is configured as the cache memory array portion, the reconfigurable memory array portion configured to store the configuration data for controlling the configuration of at least a portion of the one or more FPGA elements when the reconfigurable memory array portion is configured as the control logic array portion; and
a control logic circuit functioning to configure each reconfigurable memory array portion as the respective cache memory array portion at the one time and as the respective logic array portion at the different time.

2. The integrated circuit die stack of claim 1, wherein the reconfigurable dual function memory array die element includes:
a first reconfigurable memory array portion configured as the cache memory array portion, and
a second reconfigurable memory array portion configured as the control logic array portion.

3. The integrated circuit die element of claim 1, wherein the control logic circuit functions to configure at least one reconfigurable memory array portion after manufacturing and deployment of the integrated circuit die system.

4. The integrated circuit die system of claim 1, wherein the control logic circuit functions to switch a particular reconfigurable memory array portion from the cache memory array portion to the control logic array portion.

5. The integrated circuit die system of claim 1, wherein the control logic circuit functions to switch a particular reconfigurable memory array portion from the control logic array portion to the cache memory array portion.

6. The integrated circuit die system of claim 1, wherein the system further comprises a second reconfigurable dual function memory array die element.

7. A method performed by an integrated circuit die system, the integrated circuit die system including a microprocessor cooperative with cache memory, the method comprising:
storing, by a control logic circuit, a first control value;
configuring, based on the first control value, at least one reconfigurable memory array portion of a reconfigurable dual function memory array die element as a cache memory array portion or as a control logic array portion, each reconfigurable memory array portion of the reconfigurable dual function memory array being capable of configuration and reconfiguration as the cache memory array portion at one time or as the control logic array portion at a different time, the reconfigurable memory array portion configured to store process data when the reconfigurable memory array portion is configured as the cache memory array portion, the reconfigurable memory array portion configured to store configuration data for controlling configuration of one or more field-programmable gate array (FPGA) elements of an FPGA die element when the reconfigurable memory array portion is configured as the control logic array portion;
obtaining, by the control logic circuit, a second control value; and reconfiguring, based on the second control value, the at least one reconfigurable memory array portion.

8. The method of claim 7, wherein the reconfigurable dual function memory array die element includes:
- a first reconfigurable memory array portion configured as the cache memory array portion, and
- a second reconfigurable memory array portion configured as the control logic array portion.

9. The method of claim 7, wherein the control logic circuit functions to configure at least one reconfigurable memory array portion after manufacturing and deployment of the integrated circuit die system.

10. The method of claim 7, further comprising:
- switching, by the control logic circuit, a particular memory array portion from the storage memory array portion to the control logic array portion.

11. The method of claim 7, further comprising:
- switching, by the control logic circuit, a particular control logic array portion from the control logic array portion to the cache memory array portion.

12. The method of claim 7, wherein the system further comprises a second reconfigurable dual function memory array die element.

\* \* \* \* \*